(12) United States Patent
Chang et al.

(10) Patent No.: US 12,104,951 B2
(45) Date of Patent: Oct. 1, 2024

(54) PHOTOCOUPLER SENSING CIRCUIT AND OPERATION METHOD THEREOF

(71) Applicant: Wistron Corporation, New Taipei (TW)

(72) Inventors: Chao-Hsin Chang, New Taipei (TW); Meng-Jeong Pan, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 18/304,347

(22) Filed: Apr. 21, 2023

(65) Prior Publication Data

US 2024/0255347 A1 Aug. 1, 2024

(30) Foreign Application Priority Data

Feb. 1, 2023 (TW) .................................. 112103407

(51) Int. Cl.
*G01J 1/44* (2006.01)

(52) U.S. Cl.
CPC ........... *G01J 1/44* (2013.01); *G01J 2001/446* (2013.01)

(58) Field of Classification Search
CPC ............................ G01J 1/44; G01J 2001/446

USPC ...................................................... 250/214 R
See application file for complete search history.

(56) References Cited

U.S. PATENT DOCUMENTS

2016/0273768 A1* 9/2016 Yamada ................. F23N 5/242

FOREIGN PATENT DOCUMENTS

CN 201845061 5/2011

* cited by examiner

*Primary Examiner* — Thanh Luu
*Assistant Examiner* — Mai Thi Ngoc Tran
(74) *Attorney, Agent, or Firm* — JCIPRNET

(57) ABSTRACT

The invention provides a photocoupler sensing circuit and an operation method thereof. The photocoupler sensing circuit includes a processing circuit and a sensing circuit. The processing circuit has a first input terminal and a second input terminal. The processing circuit outputs a first signal according to a connection status of the first input terminal and the second input terminal being short or open. The sensing circuit is coupled to the processing circuit and receives the first signal. The sensing circuit determines to output a sensing signal to a system terminal according to the first signal, so that the system terminal determines whether the connection status of the first input terminal and the second input terminal is short or open according to the sensing signal. The sensing circuit includes a single-diode photocoupler coupled to the system terminal.

20 Claims, 10 Drawing Sheets

| 1 | IN1 and IN2 are open | D1 is forward-biased | NM1 and PM1 are off | NM2 is on | NM3 is off | A photocoupler is not on |
|---|---|---|---|---|---|---|
| 2 | IN1 and IN2 are short | D1 is forward-biased | NM1 and PM1 are off | NM2 is off | NM3 is on | The photocoupler is on |
| 3 | IN1 provides a voltage | D1 is reverse-biased | NM1 is on, and PM1 is off | NM2 is off | NM3 is on | The photocoupler is on |
| 4 | IN2 provides the voltage | D1 is reverse-biased | NM1 is on, and PM1 is off | NM2 is off | NM3 is on | The photocoupler is on |
| 5 | IN1 and IN2 are reversely connected | D1 is reverse-biased | NM1 is on, and PM1 is off | NM2 is off | NM3 is on | The photocoupler is on |

| | | | | | |
|---|---|---|---|---|---|
| 1 | IN1 and IN2 are open | D1 is forward-biased | NM1 and PM1 are off | NM2 is on | NM3 is off | A photocoupler is not on |
| 2 | IN1 and IN2 are short | D1 is forward-biased | NM1 and PM1 are off | NM2 is off | NM3 is on | The photocoupler is on |
| 3 | IN1 provides a voltage | D1 is reverse-biased | NM1 is on, and PM1 is off | NM2 is off | NM3 is on | The photocoupler is on |
| 4 | IN2 provides the voltage | D1 is reverse-biased | NM1 is on, and PM1 is off | NM2 is off | NM3 is on | The photocoupler is on |
| 5 | IN1 and IN2 are reversely connected | D1 is reverse-biased | NM1 is on, and PM1 is off | NM2 is off | NM3 is on | The photocoupler is on |

FIG. 7

PHOTOCOUPLER SENSING CIRCUIT AND OPERATION METHOD THEREOF

CROSS-REFERENCE TO RELATED APPLICATION

This application claims the priority benefit of Taiwan application serial no. 112103407, filed on Feb. 1, 2023. The entirety of the above-mentioned patent application is hereby incorporated by reference herein and made a part of this specification.

BACKGROUND

Technical Field

The disclosure relates to a sensing technology, and particularly relates to a photocoupler sensing circuit and an operation method thereof.

Description of Related Art

Generally speaking, in the circuit application of system external power supply, the circuit design of dual-diode photocoupler is usually used to achieve the requirement of bidirectional power transmission. Therefore, if the circuit design of single-diode photocoupler is used at this stage, the digital input digital output (DIDO) of the system internal power supply (dry contact) and the system external power supply (wet contact) cannot be supported simultaneously.

Therefore, a circuit design of single-diode photocoupler which can support the system internal power supply and the system external power supply simultaneously and achieve the bidirectional digital power transmission is needed.

SUMMARY

The disclosure provides a photocoupler sensing circuit and an operation method thereof, which can support the digital input digital output (DIDO) adopting the system internal power supply (or referred to as dry contact) and the system external power supply (or referred to as wet contact) simultaneously.

According to some embodiments of the disclosure, a photocoupler sensing circuit is provided. The photocoupler sensing circuit includes a processing circuit and a sensing circuit. The processing circuit has a first input terminal and a second input terminal. A first signal is output according to a connection status of the first input terminal and the second input terminal of the processing circuit being short or open. The sensing circuit is coupled to the processing circuit and receives the first signal. The sensing circuit determines to output a sensing signal to a system terminal according to the first signal, so that the system terminal determines whether the connection status of the first input terminal and the second input terminal is short or open according to the sensing signal. The sensing circuit includes a single-diode photocoupler coupled to the system terminal.

According to some embodiments of the disclosure, an operation method of a photocoupler sensing circuit is provided. The operation method of the photocoupler sensing circuit includes the following steps. A first signal is output according to a connection status of a first input terminal and a second input terminal of a processing circuit being short or open. The first signal is transmitted to a sensing circuit to determine according to the first signal and a sensing signal is output. Whether the connection status is short or open is determined according to the sensing signal. The sensing circuit includes a single-diode photocoupler, and the single-diode photocoupler is determined to be on or not on according to the first signal.

Based on the above, the disclosure designs a dual-terminal digital input and output which can support the system internal power supply (open or short) and the system external power supply (source or sink) simultaneously by using the single-diode photocoupler, so that end users may flexibly choose to use the desired type of digital input and output conveniently, and there is no need to worry about whether the digital input and output function of the machine will fail from an incorrect connection due to which power supply system the external digital input and output belongs to.

In order to make the above-mentioned features and advantages of the disclosure more comprehensible, the following embodiments are described in detail together with the accompanying drawings.

BRIEF DESCRIPTION OF THE DRAWINGS

FIG. 7 illustrates a diagram of a control status of an internal switch of a photocoupler sensing circuit according to an embodiment of the disclosure.

DESCRIPTION OF THE EMBODIMENTS

Figure 1:
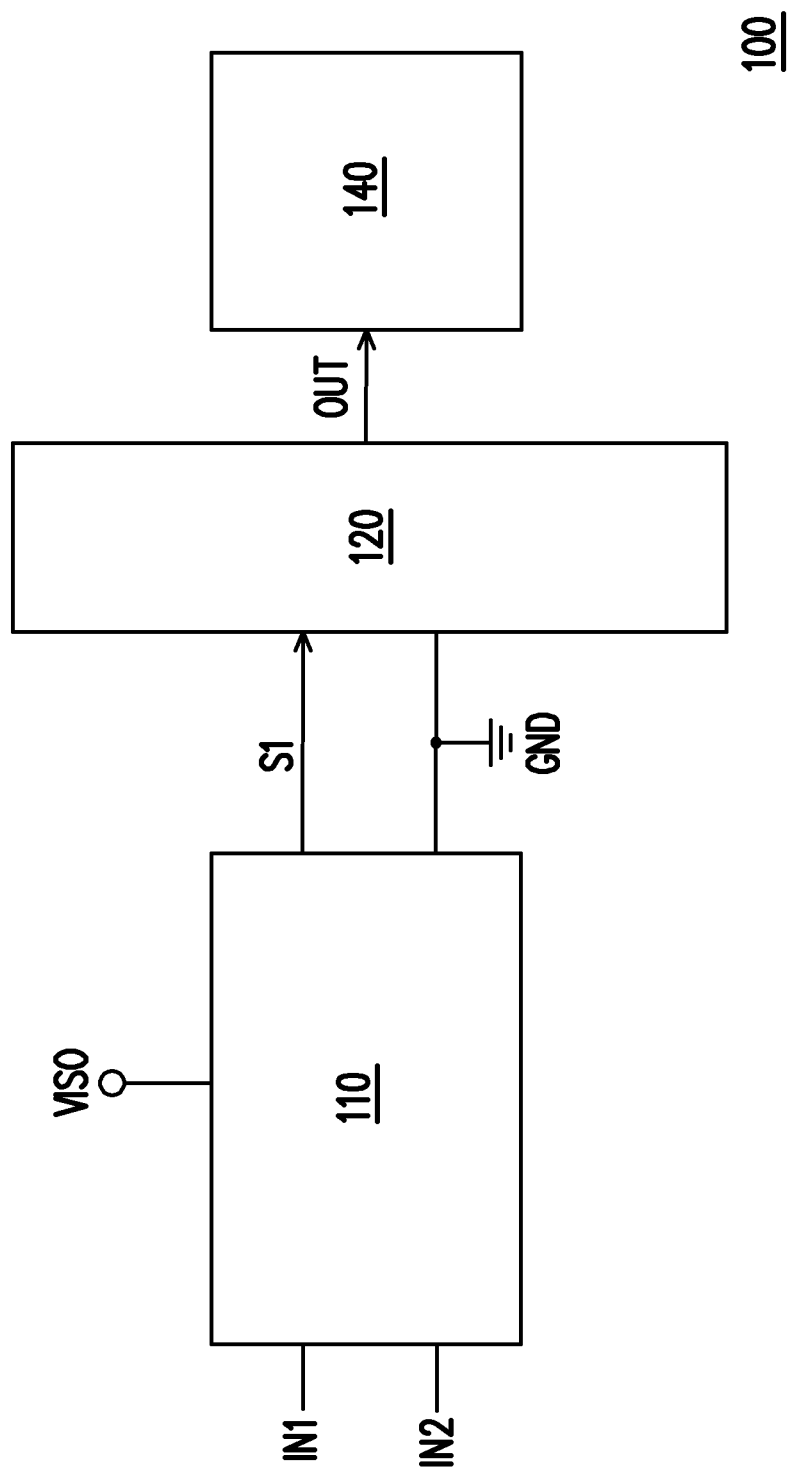
FIG. 1 illustrates a schematic diagram of a photocoupler sensing circuit according to an embodiment of the disclosure.

Features of the inventive concept and methods of achieving the same may be easily understood by referring to the following detailed description of the embodiments and the accompanying drawings. In the accompanying drawings, the same reference numerals may denote the same components throughout the specification. However, the disclosure may be implemented in various different forms and should not be construed as limited to only the embodiments set forth herein. Unless otherwise indicated, the same reference numerals denote the same components throughout the accompanying drawings and written description, and thus description thereof will not be repeated. In the drawings, the relative sizes of components, layers, and regions may be exaggerated for clarity.

The terms used herein are for the purpose of describing particular embodiments only and is not intended to limit the disclosure. As used herein, the singular form "a/an" is intended to include the plural forms unless the context clearly dictates otherwise. It will be further understood that the terms "comprises/comprising", "have/having" and "includes/including" when used in this specification mean the presence of the stated features, integers, steps, operations, components, components and/or groups thereof, but the presence or addition of one or more other features, integers, steps, operations, components, components and/or groups thereof is not precluded. As used herein, the term "and/or" includes any and all combinations of one or more of the associated listed items.

Additionally, the use of "may" when describing embodiments of the disclosure means "one or more embodiments of the disclosure."

When an embodiment may be implemented differently, a particular order of processing may be executed differently than that described. For example, two consecutively described processes may be performed substantially simultaneously or in an order reverse to the described order.

Electronic or electronic devices according to embodiments of the disclosure described herein and/or any other related devices or components may be implemented by utilizing any suitable hardware, firmware (such as an application specific integrated circuit), software, or a combination of software, firmware, and hardware. For example, various components of these devices may be formed on an integrated circuit (IC) chip or on separate IC chips. In addition, various components of these devices may be implemented on flexible printed circuit films, tape carrier packages (TCP), printed circuit board (PCB), or formed on a substrate. In addition, the various components of these devices may be running on one or more processors in one or more computing devices, executing computer program commands, and interacting with other system components to perform the processes or threads of execution of the various functions described herein.

Unless otherwise defined, all terms (including technical and scientific terms) used herein have the same meaning as commonly understood by one of ordinary skill in the art to which this disclosure belongs. It will be further understood that terms (such as those defined in commonly used dictionaries) should be interpreted to have meanings consistent with their meanings in the context of the relevant art and/or in this specification, and should not be interpreted in an idealized or overly formalized way unless otherwise expressly defined herein.

A photocoupler is also known as an optocoupler, an optoisolator, and an optical isolator, referred to as a photocoupler. A photocoupler is a device using light (including visible light, infrared, etc.) as a medium to transmit electrical signals, and a function thereof is to isolate an input circuit and an output circuit at ordinary times and to transmit the electrical signals through an isolation layer when necessary. A photocoupler may transmit a signal between two circuits not sharing a common ground and is not being affected even if a high voltage is between the two circuits. Generally, an input-to-output withstand voltage of a photocoupler may reach 10 kV, and a voltage change rate may reach more than 10 kV/μs.

Photocouplers may be divided into two types, analog and digital, and usually comprise photoemitters and photodetectors. The photoemitter and the photodetector are usually integrated into the same package, but no electrical or physical connection is between the photoemitter and the photodetector other than a light beam. A common photocoupler is to place a light-emitting diode (LED) and a light transistor in an opaque package. Other combinations are light-emitting diode-thyristors and light bulb-photoresistors.

Photocouplers are generally used to transmit digital signals, but the photocouplers may also be used to transmit analog signals. Photocouplers are widely used in electrical isolation, voltage conversion, drive circuits, and industrial communications.

A photocoupler generally comprises three parts, light emission, light reception, and signal amplification. The input electrical signal drives a light-emitting source to make it emit light, and then is received by the photodetector to generate light current, which is further amplified and output. This completes the conversion between electricity and light, so a function of input and output isolation is achieved. Since the input and output of the photocoupler are isolated from each other, a good electrical insulation and an anti-interference ability are achieved. Also, due to an input terminal of the photocoupler being a current-type low-resistance component, a strong common-mode rejection capability. Therefore, a signal-to-noise ratio may be improved as a terminal isolation component in long-distance transmission of information. In computer digital communication and real-time control, when being used as a signal isolation interface component, the reliability of the operation may be greatly improved.

The light-emitting source of a photocoupler is generally an infrared light-emitting diode converting electrical energy to a light of a specific wavelength. A closed optical channel (also referred to as a dielectric channel) is between the emitting source and a receiver.

The receiver of the photocoupler is a light sensor configured to sense the light of the specific wavelength, which may be converted to electrical energy, and may also modulate a current signal provided by an external power supply. The receiver may be a photoresistor, a photodiode, a phototransistor, a silicon controlled rectifier (SCR). In addition to emitting the light, the light-emitting diode may also be used as a light-sensing element at the same time. Therefore, using the light-emitting diode as the light-sensing element is a symmetrical bidirectional photocoupler. For example, in a photo-coupled solid-state relay, a photocoupler with a photodiode is used to drive a power switch, usually a pair of complementary metal-oxide-semiconductor field-effect transistor (MOSFET).

FIG. 1 illustrates a schematic diagram of a photocoupler sensing circuit according to an embodiment of the disclosure for the convenience of description, but the disclosure is not limited thereto.

Referring to FIG. 1, a photocoupler sensing circuit 100 may include a processing circuit 110 and a sensing circuit 120. A terminal of the processing circuit 110 may receive system internal power supply (dry contact) or system external power supply (wet contact), and another terminal of the processing circuit 110 may be connected to a system ground GND. The system internal power supply is collectively referred to as a system power source VISO in this disclosure. For example, the system power source VISO may supply power to an object to be tested, and the disclosure is not limited thereto. Generally speaking, the system external power supply may be determined by a user according to requirements of a system or a circuit specification. For example, the system ground GND may generally be a lowest voltage level in a system or a machine. In an embodiment, a voltage level of the system ground GND may be adjusted by the user from the power from the system external power supply through a wiring configuration of the system.

In an embodiment, the processing circuit 110 is coupled to a connector (not shown) used by the user outside the machine or the system. In an embodiment, the processing circuit 110 has a first input terminal IN1 and a second input terminal IN2 respectively coupled to the connector. Therefore, the connector may transmit the system external power supply to the machine or the system through the first input terminal IN1 and the second input terminal IN2 of the processing circuit 110. In an embodiment, the connector has more than two input terminals, and the disclosure is not limited thereto. According to a connection status of the first input terminal IN1 and the second input terminal IN2 of the connector being short or open, internal components of the processing circuit 110, for example, two terminal node points corresponding to resistor components, condenser components, or inductor components may obtain different divided voltages from the connector, and switching statuses of switching components in the processing circuit 110 are affected by these different divided voltages. A connection status sensed by a system terminal may be controlled through the switching statuses of the switching components in the processing circuit 110, so that the system terminal may send an alarm or display a picture according to the sensed connection status to remind the user about the connection status of the connector in real time to prevent a misconnection, a reverse connection, or an unexpected connection of the connector, so as to achieve the technical effect of protecting the internal circuit of the system or the internal components of the machine.

In an embodiment, the sensing circuit 120 is coupled to the processing circuit 110. The sensing circuit 120 may receive a first signal S1 transmitted by the processing circuit 110, and determines to output a sensing signal OUT to a system terminal 140 according to the first signal S1, so that the system terminal 140 may determine whether the connection status of the first input terminal IN1 and the second input terminal IN2 is short or open according to a voltage level (or a current level) of the sensing signal OUT.

In an embodiment, the sensing circuit 120 further includes a single-diode photocoupler (not shown in this drawing, please refer to the following description) coupled to the system terminal 140, and the single-diode photocoupler may determine an on/off status thereof according to the first signal S1. In an embodiment, the single-diode photocoupler may be determined to be on or not on (off) according to a voltage level of the first signal S1. In an embodiment, if the single-diode photocoupler does not receive the first signal S1 or the received first signal S1 is higher than a voltage level of the system power source VISO, then the single-diode photocoupler is not on. In an embodiment, if the single-diode photocoupler receives the first signal S1 or the received first signal S1 is lower than the voltage level of the system power source VISO, then the single-diode photocoupler is on.

Figure 2:
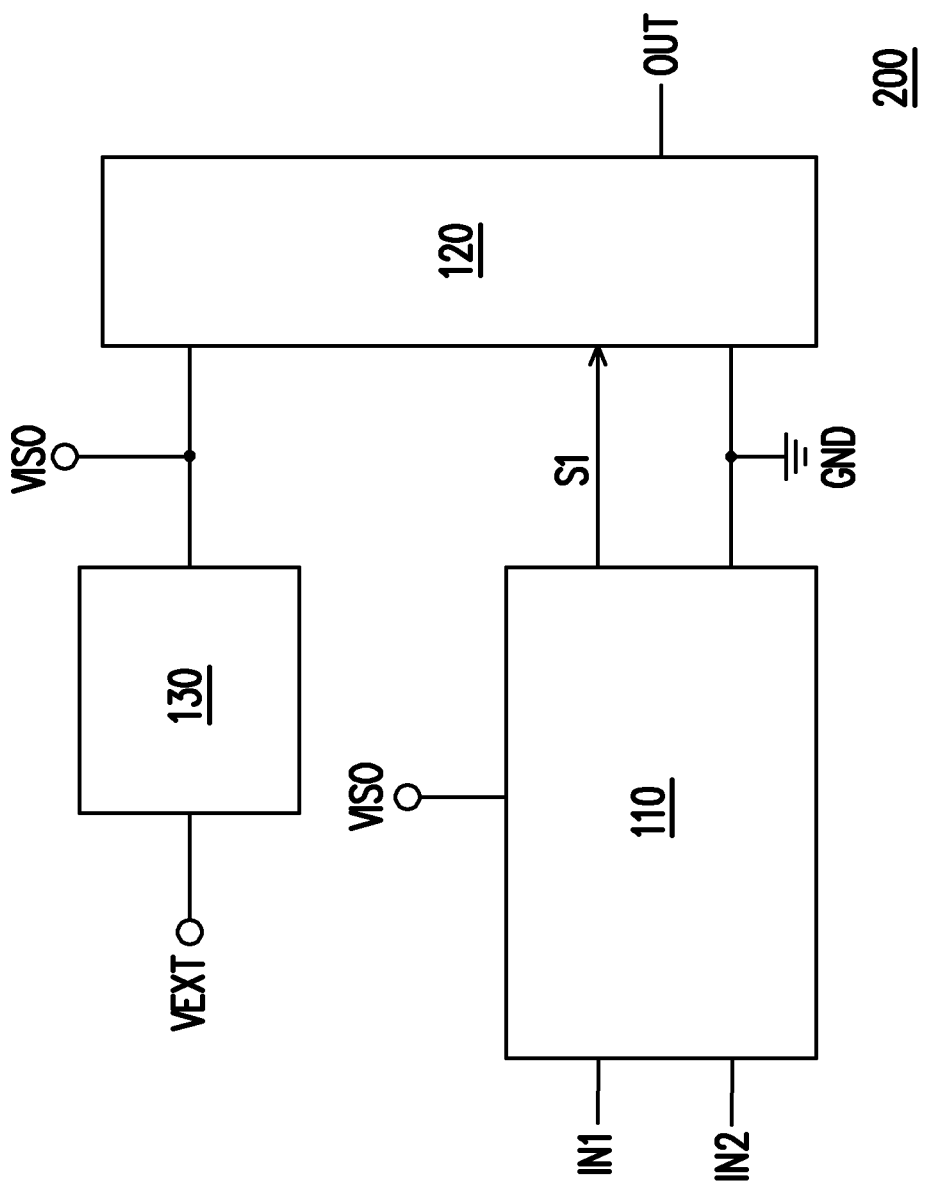
FIG. 2 illustrates a schematic diagram of a photocoupler sensing circuit according to an embodiment of the disclosure.

FIG. 2 illustrates a schematic diagram of a photocoupler sensing circuit according to an embodiment of the disclosure for the convenience of description, but the disclosure is not limited thereto.

Referring to FIG. 2, a photocoupler sensing circuit 200 includes the processing circuit 110, the sensing circuit 120, and a voltage converter circuit 130. A terminal of the processing circuit 110 may receive the system power source VISO, and another terminal of the processing circuit 110 may be connected to the system ground GND.

In an embodiment, the voltage converter circuit 130 is coupled to the sensing circuit 120. The voltage converter circuit 130 may receive a system external power supply source VEXT, and may isolate the system external power supply source VEXT from the system power source VISO, so as to prevent the system external power supply source VEXT from being affected by unnecessary interferences and thus affecting the stability of the system power source VISO.

The system external interferences may be, for example, electromagnetic interferences (EMI) or electrostatic discharge (ESD) interferences.

In an embodiment, the voltage converter circuit 130 may be, for example, a DC/DC converter, which is a converter that converts a direct current (DC) to a DC, specifically, a device which converts a DC to a voltage. A range of input voltages may be converted to a constant output voltage. A conversion method thereof includes a linear regulator and a switching regulator. In addition, in an embodiment, a circuit configuration and the number of input pins and output pins (for example, four pins, six pins, or eight pins) and functions of the DC/DC converter have various applications depending on an increase or a decrease of a voltage input by the user, and the disclosure is not limited thereto. In an embodiment, the voltage converter circuit 130 may also be an AC/DC converter, and the disclosure is not limited thereto.

Figure 3:
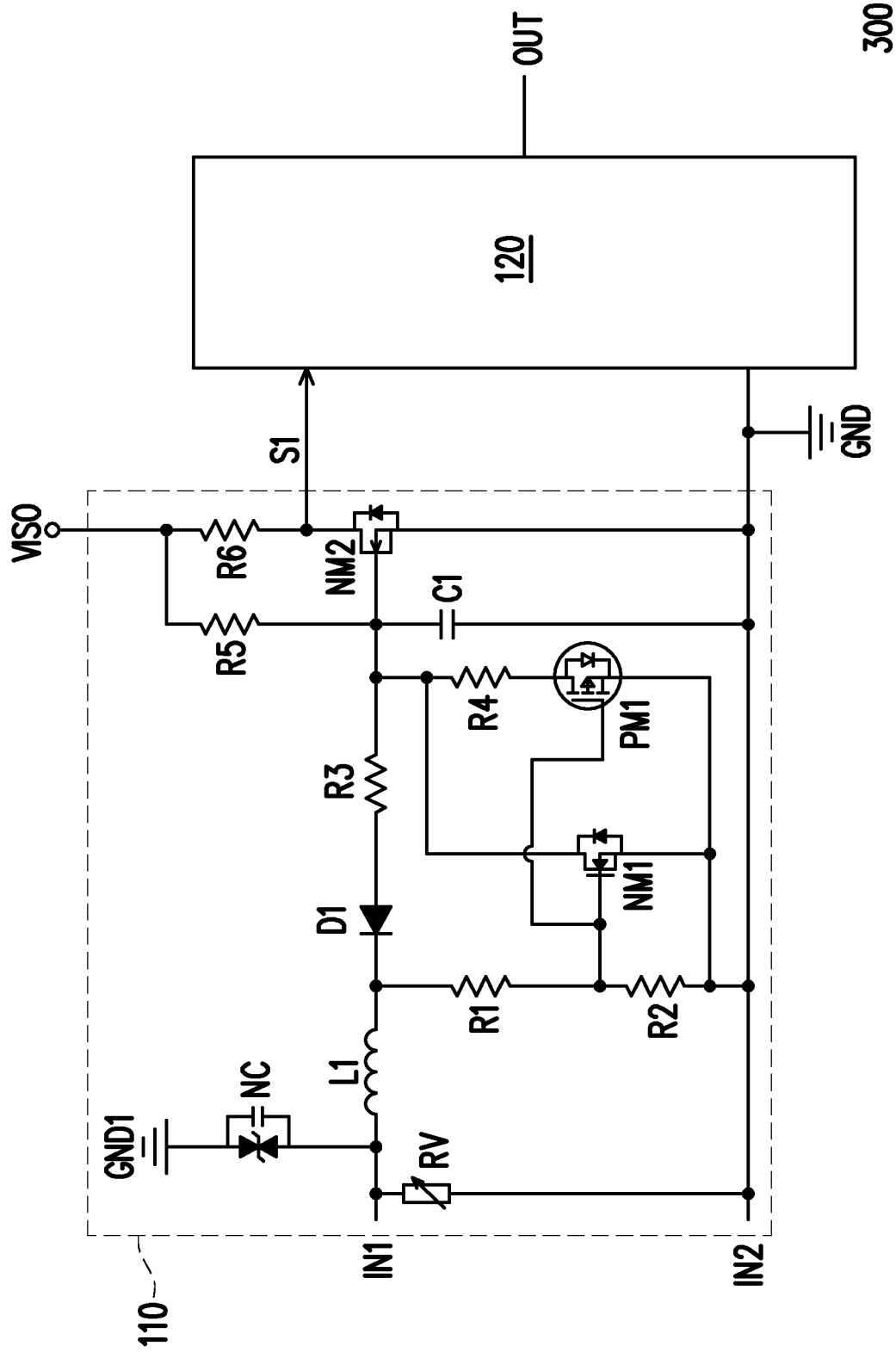
FIG. 3 illustrates a partial schematic diagram of a processing circuit of a photocoupler sensing circuit according to an embodiment of the disclosure.

FIG. 3 illustrates a partial schematic diagram of a processing circuit of a photocoupler sensing circuit according to an embodiment of the disclosure for the convenience of description, but the disclosure is not limited thereto.

Referring to FIG. 3, a photocoupler sensing circuit 300 includes the processing circuit 110 and the sensing circuit 120. A terminal of the processing circuit 110 may receive the system power source VISO, and another terminal of the processing circuit 110 may be coupled to the system ground GND. In an embodiment, a terminal of the sensing circuit 120 may be coupled to the system power source VISO (not shown), another terminal of the sensing circuit 120 may be coupled to the system ground GND, and one of the terminals of the sensing circuit 120 may be configured to receive the first signal S1 sent by the processing circuit 110.

In an embodiment, the processing circuit 110 includes a first transistor NM1, a second transistor PM1, a third transistor NM2, a protection diode NC, a protection resistor RV, a first switching diode D1, a first inductor L1, a first condenser C1, and multiple resistors R1, R2, R3, R4, R5, and R6.

Persons skilled in the art should understand that, for the sake of convenience, the left side and the upper side are collectively referred to as a first terminal for the above-mentioned electronic components, and the right side and the lower side are referred to as a second terminal for the above-mentioned electronic components. However, the spatially relative terms are intended to cover different orientations of the device in use or operation in addition to the orientation shown in the drawings, and are not limited to the application of the above terms.

In an embodiment, the first transistor NM1 and the third transistor NM2 may be, for example, N-type metal-oxide-semiconductors (NMOS), and the second transistor PM1 is a P-type metal-oxide-semiconductor (PMOS). In some examples, NMOS and PMOS may also be interchanged with appropriate connection line structures to achieve the same effect as the embodiment. In other words, other types of transistor combinations are also included in the modified embodiments conceived herein. In an embodiment, the first transistor NM1, the second transistor PM1, and the third transistor NM2 may be used as switches.

In an embodiment, a first terminal of the protection diode NC is coupled to a system external ground GND1, and a second terminal of the protection diode NC is coupled to a first terminal of the first inductor L1, the first input terminal IN1, and a first terminal of the protection resistor RV. In an embodiment, the protection diode NC may be used as a normal closed contact under normal working conditions. For example, the protection diode NC is a contact in a closed status when no power is applied. In an embodiment, the protection diode NC may be, for example, a transient voltage suppression diode (or a transient voltage suppressor, a TVS diode). In an embodiment, the protection diode NC is an overvoltage protection component having bidirectional voltage stabilizing characteristics and bidirectional negative resistance characteristics, and may be used to protect components inside the system from surges such as static electricity and power fluctuations, and thus may be used as a component for overvoltage protection and ESD protection.

In other words, in an embodiment, the protection diode NC may resist a pulse current, so as to clamp an excessive voltage and protect the components inside or in the rear part of the system. In an embodiment, the protection diode NC is similar to a zener diode, and may be controlled to be on or off by using reverse characteristic of the diode. In an embodiment, when the circuit or system is working normally, the protection diode NC is in an off status and only consumes a small drain current. When an overvoltage such as a surge is applied from an external power supply, the protection diode NC may be turned into an on status.

In an embodiment, the first terminal and a second terminal of the protection resistor RV are respectively coupled to the first input terminal IN1 and the second input terminal IN2. Moreover, the first terminal of the protection resistor RV is coupled to a second terminal of the protection diode NC. In an embodiment, the protection resistor RV may be a varistor, but the disclosure is not limited thereto. In an embodiment, the protection resistor RV is an electronic component having non-ohmic conductor characteristics, and a resistance value thereof changes with an external voltage. In other words, a curve of current-voltage characteristics of the protection resistor RV is significantly non-linear. In an embodiment, the resistance value of the protection resistor RV changes with a voltage difference between the first input terminal IN1 and the second input terminal IN2.

In an embodiment, a first terminal (an N-type terminal) of the first switching diode D1 is coupled to a second terminal of the first inductor L1 and a first terminal of the resistor R1. A second terminal (a P-type terminal) of the first switching diode D1 is coupled to a first terminal of the resistor R3.

In an embodiment, the first terminal of the resistor R1 is coupled to the second terminal of the first inductor L1, and a second terminal of the resistor R1 is coupled to a first terminal of the resistor R2 and a gate terminal of the first transistor NM1. A second terminal of the resistor R2 is coupled to the second input terminal IN2, a source terminal of the first transistor NM1, and the system ground GND. The first terminal of the resistor R3 is coupled to the second terminal (the P-type terminal) of the first switching diode D1, and a second terminal of the resistor R3 is coupled to a first terminal of the resistor R4, a second terminal of the resistor R5, and a gate terminal of the third transistor NM2. The first terminal of the resistor R4 is coupled to a drain terminal of the first transistor NM1, the second terminal of the resistor R3, a first terminal of the first condenser C1, the second terminal of the resistor R5, and the gate terminal of the third transistor NM2. A first terminal of the resistor R5 is coupled to the system power source VISO and a first terminal of resistor R6, and the second terminal of the resistor R5 is coupled to the first terminal of the first condenser C1 and the gate terminal of the third transistor NM2. The first terminal of the resistor R6 is coupled to the system power source VISO, and a second terminal of the resistor R6 is coupled to a drain terminal of the third transistor NM2. The system power source VISO may generate the first signal S1 at the drain terminal of the third transistor NM2 through the resistor R6 and transmit the first signal S1 to the sensing circuit 120.

In an embodiment, please refer to FIG. 4A to FIG. 4D. The source terminal of the first transistor NM1 is coupled to the second input terminal IN2. A gate terminal of the second transistor PM1 is coupled to the gate terminal of the first transistor NM1, and a source terminal of the second transistor PM1 is coupled to the source terminal of the first transistor NM1 and the second input terminal IN2. The gate terminal of the third transistor NM2 is coupled to the drain terminal of the first transistor NM1, and a source terminal of the third transistor NM2 is coupled to the second input terminal IN2. The gate terminal of the third transistor NM2 is coupled to the gate terminal of the first transistor NM1 through the first switching diode D1, a gate terminal of a fourth transistor NM3 is coupled to the drain terminal of the third transistor NM2, and the gate terminal of the fourth transistor NM3 is coupled to the system power source VISO and the source terminal thereof is coupled to the system ground GND.

In an embodiment, the gate terminal of the third transistor NM2 is coupled to the P-type terminal of the first switching diode D1, and the gate terminal of the first transistor NM1 is coupled to the N-type terminal of the first switching diode D1. The gate terminal of the second transistor PM1 is coupled to the N-type terminal of the first switching diode D1, and a drain terminal of the second transistor PM1 is coupled to the P-type terminal of the first switching diode D1.

In an embodiment, the processing circuit 110 determines whether the first transistor NM1 is on or not on according to a magnitude relationship between a first voltage between the source terminal and the gate terminal of the first transistor NM1 and a first threshold voltage of the first transistor NM1. For example, if the first voltage between the source terminal and the gate terminal of the first transistor NM1 is greater than the first threshold voltage of the first transistor NM1, then the first transistor NM1 may be on. On the contrary, if the first voltage between the source terminal and the gate terminal of the first transistor NM1 is smaller than the first threshold voltage of the first transistor NM1, then the first transistor NM1 is not on or is off.

Similarly, the processing circuit 110 determines whether the second transistor PM1 is on or not on according to a magnitude relationship between a second voltage between the source terminal and the gate terminal of the second transistor PM1 and a second threshold voltage of the second transistor PM1. For example, if the second voltage between the source terminal and the gate terminal of the second transistor PM1 is greater than the second threshold voltage of the second transistor PM1, then the second transistor PM1 is not on or is off. On the contrary, if the second voltage between the source terminal and the gate terminal of the second transistor PM1 is smaller than the second threshold voltage of the second transistor PM1, then the second transistor PM1 may be on. An on/off relationship of the third transistor NM2 and the fourth transistor NM3 (please refer to the following description) may be deduced in the same way, and will not be repeated here.

FIG. 4A to FIG. 4D illustrates schematic diagrams of a sensing circuit having a single-diode photocoupler of a photocoupler sensing circuit according to an embodiment of the disclosure for the convenience of description, but the disclosure is not limited thereto.

Please refer to FIG. 4A to FIG. 4D and FIG. 3. A photocoupler sensing circuit 400 includes the processing circuit 110 and the sensing circuit 120. In an embodiment, the processing circuit 110 may further include the fourth transistor NM3, a resistors R7, and a resistor R8 in addition to the components shown in FIG. 3. The sensing circuit 120 includes a single-diode photocoupler 220, multiple resistors R9, R10, R11, and R12, and a second condenser C2.

In an embodiment, the single-diode photocoupler 220 includes a light-emitting diode and a bicarrier junction transistor. When the single-diode photocoupler 220 receives the first signal or when a voltage of a drain terminal of the fourth transistor NM3 is lower than the system power source VISO, the light-emitting diode may be driven, so that the bicarrier junction transistor of the opposite side is on, and the sensing signal OUT is generated and transmitted to outside of the system to achieve the purpose of transmitting the signal. For example, when the single-diode photocoupler 220 is on, the sensing signal OUT is a low voltage level (e.g., logic low or logic 0) relative to the system external power supply source VEXT. Therefore, the system terminal may determine whether a connection status of the user side is open, short or which input terminal (IN1 or IN2) the user provides the system external power supply source according to the received sensing signal OUT. In an embodiment, an emitter terminal of the bicarrier junction transistor of the single-diode photocoupler 220 may be connected to a system external ground GND2.

In an embodiment, a terminal of the processing circuit 110 may receive the system power source VISO, and another terminal of the processing circuit 110 may be coupled to the system ground GND. In an embodiment, one of terminals of the sensing circuit 120 in the system may be coupled to the system power source VISO, another terminal of the sensing circuit 120 in the system may be coupled to the system ground GND, and the sensing circuit 120 receives the first signal S1 sent by the processing circuit 110 through a connection line path of the fourth transistor NM3 being coupled to the system ground GND.

In an embodiment, a first terminal of the resistor R7 of the processing circuit 110 is connected to the second terminal of the resistor R6 and the drain terminal of the fourth transistor NM3. A second terminal of the resistor R7 is connected to a first terminal of the resistor R8 and the gate terminal of the fourth transistor NM3. A second terminal of the resistor R8 is coupled to the system ground GND, the source terminal of the third transistor, the second input terminal IN2, and a source terminal of the fourth transistor NM3. In an embodiment, the drain terminal of the fourth transistor NM3 is coupled to the N-type terminal of at least one light-emitting diode of the single-diode photocoupler 220.

In an embodiment, a second terminal of the resistor R9 and a second terminal of the resistor R10 of the sensing circuit 120 are respectively connected to the P-type terminals of the two light-emitting diodes. A first terminal of the resistor R9 and a first terminal of the resistor R10 are both connected to the system power source VISO. Among them, the resistor R9 and the resistor R10 are positioned in the system. In an embodiment, a second terminal of the resistor R11 and a second terminal of the resistor R12 in the sensing circuit 120 are respectively connected to collector terminals of two bicarrier junction transistors. A first terminal of the resistor R11 and a first terminal of the resistor R12 are both coupled to the system external power supply source VEXT. Therefore, when the single-diode photocoupler 220 is not on, the sensing signal OUT of a high voltage level (e.g., logic high or logic 1) relative to the system power source VISO may be generated by the system external power supply source VEXT of the sensing signal OUT through the resistor R12.

Figure 4A:
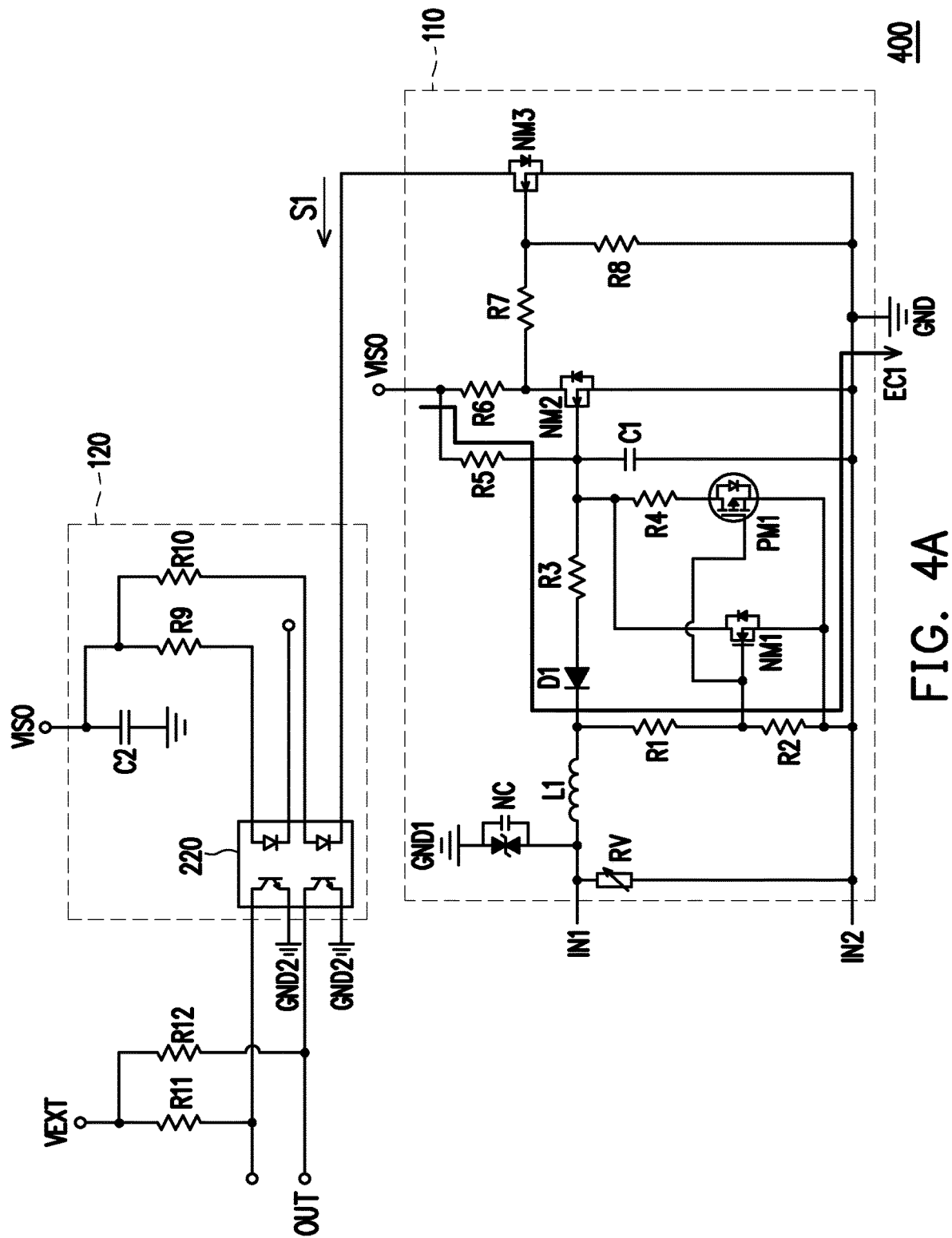
FIG. 4A to FIG. 4D illustrates schematic diagrams of a sensing circuit having a single-diode photocoupler of a photocoupler sensing circuit according to an embodiment of the disclosure.

Please refer to FIG. 4A. In an embodiment, if a connection status of the first input terminal IN1 and the second input terminal IN2 is open, the first transistor NM1 and the second transistor PM1 are in the off status and the third transistor NM2 is in an on status. At this time, a first current EC1 is output from the system power source VISO and flows to the system ground GND through the first switching diode D1 being forward-on. Therefore, the processing circuit 110 does not output the first signal S1, so as to cause the single-diode photocoupler 220 to be not on. The sensing circuit 120 outputs the sensing signal OUT having a high voltage level in response to not receiving the first signal S1. At this time, the system may determine that the connection status of the first input terminal IN1 and the second input terminal IN2 is open according to the sensing signal OUT having the high voltage level. For example, when the system power source VISO is 3.3 volts (V), a threshold voltage of the first transistor NM1, the third transistor NM2, and the fourth transistor NM3 is 2.5 V, and a threshold voltage of the second transistor PM1 is −1 V, since an external user inserts a digital input digital output (DIDO) connector, and the connection status of the first input terminal IN1 and the second input terminal IN2 is open (not short), a current flowing through the resistor R5 is 0.148 milliamps (mA). A voltage difference between the gate terminal and the source terminal of the first transistor NM1 is 0.445 V and is smaller than the threshold voltage thereof (2.5V), a voltage difference between the gate terminal and the source terminal of the second transistor PM1 is 0.445 V and is smaller than the threshold voltage thereof (−1V), and a voltage difference between the gate terminal and the source terminal of the third transistor NM2 is 0.445 V and is greater than the threshold voltage thereof, so the first transistor NM1 and the second transistor PM1 are off (off or open), and the third transistor NM2 is on (on or short), causing the fourth transistor NM3 to be off, so that the single-diode photocoupler 220 is not on. The output of the sensing signal OUT is the high voltage level, so the system may determine that the connection status of the first input terminal IN1 and the second input terminal IN2 is currently open. Based on the above, the configuration and design of the processing circuit 110 designed in this application with the first switching diode D1 and the first transistor NM1, the second transistor PM1, the third transistor NM2, and the fourth transistor NM3 may allow the user to work normally and protect a peripheral circuit of DIDO of the machine when the user inserts the connector and the first input terminal IN1 and the second input terminal IN2 are not short (dry contact open mode), and may monitor the power supply status of the connector in real time.

Figure 4B:
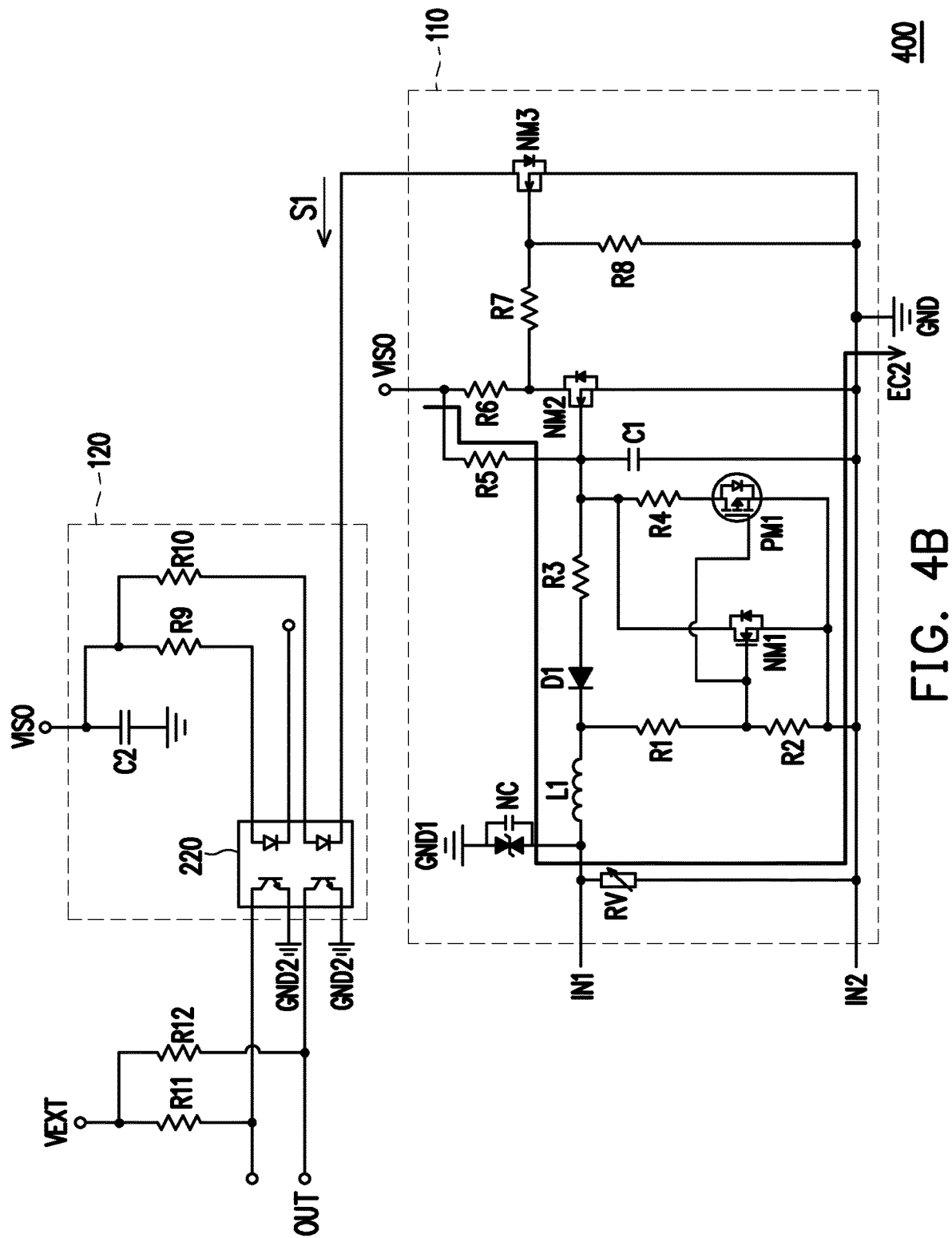

Please refer to FIG. 4B. In an embodiment, if the connection status of the first input terminal IN1 and the second input terminal IN2 is short, the first transistor NM1, the second transistor PM1, and the third transistor NM2 are in the off status. A second current EC2 is output from the system power source VISO and flows to the system ground GND through the first switching diode D1 being forward-on and the protection resistor RV. At this time, the processing circuit 110 outputs the first signal S1 having a low voltage level through the fourth transistor NM3 so that the single-diode photocoupler 220 is on. Therefore, the sensing circuit 120 may output the sensing signal OUT having a low voltage level according to the first signal S1, and the system may determine that the connection status of the first input terminal IN1 and the second input terminal IN2 is short according to the sensing signal OUT having the low voltage level. For example, since the external user inserts the DIDO connector, and the connection status of the first input terminal IN1 and the second input terminal IN2 is short (that is, the first input terminal IN1 and the second input terminal IN2 are together short to the system ground GND through external lines), the current flowing through the resistor R5 is 0.52 mA. The voltage difference between the gate terminal and the source terminal of the first transistor NM1 is 0 V and is smaller than the threshold voltage thereof (2.5V), the voltage difference between the gate terminal and the source terminal of the second transistor PM1 is 0 V and is greater than the threshold voltage thereof (−1V), and the voltage difference between the gate terminal and the source terminal of the third transistor NM2 is 0.86 V and is smaller than the threshold voltage thereof (2.5V), so the first transistor NM1 and the second transistor PM1 are off (off or open), and the third transistor NM2 is off, causing the fourth transistor NM3 to be on, so that the single-diode photocoupler 220 is on. The output of the sensing signal OUT is the low voltage level, so the system may determine that the connection status of the first input terminal IN1 and the second input terminal IN2 is currently short. Based on the above, the configuration and design of the processing circuit 110 designed in this application with the first switching diode D1 and the first transistor NM1, the second transistor PM1, the third transistor NM2, and the fourth transistor NM3 may allow the user to work normally and protect the peripheral circuit of DIDO of the machine when the user inserts the connector and the first input terminal IN1 and the second input terminal IN2 are short (dry contact short mode), and may monitor the power supply status of the connector in real time.

Figure 4C:
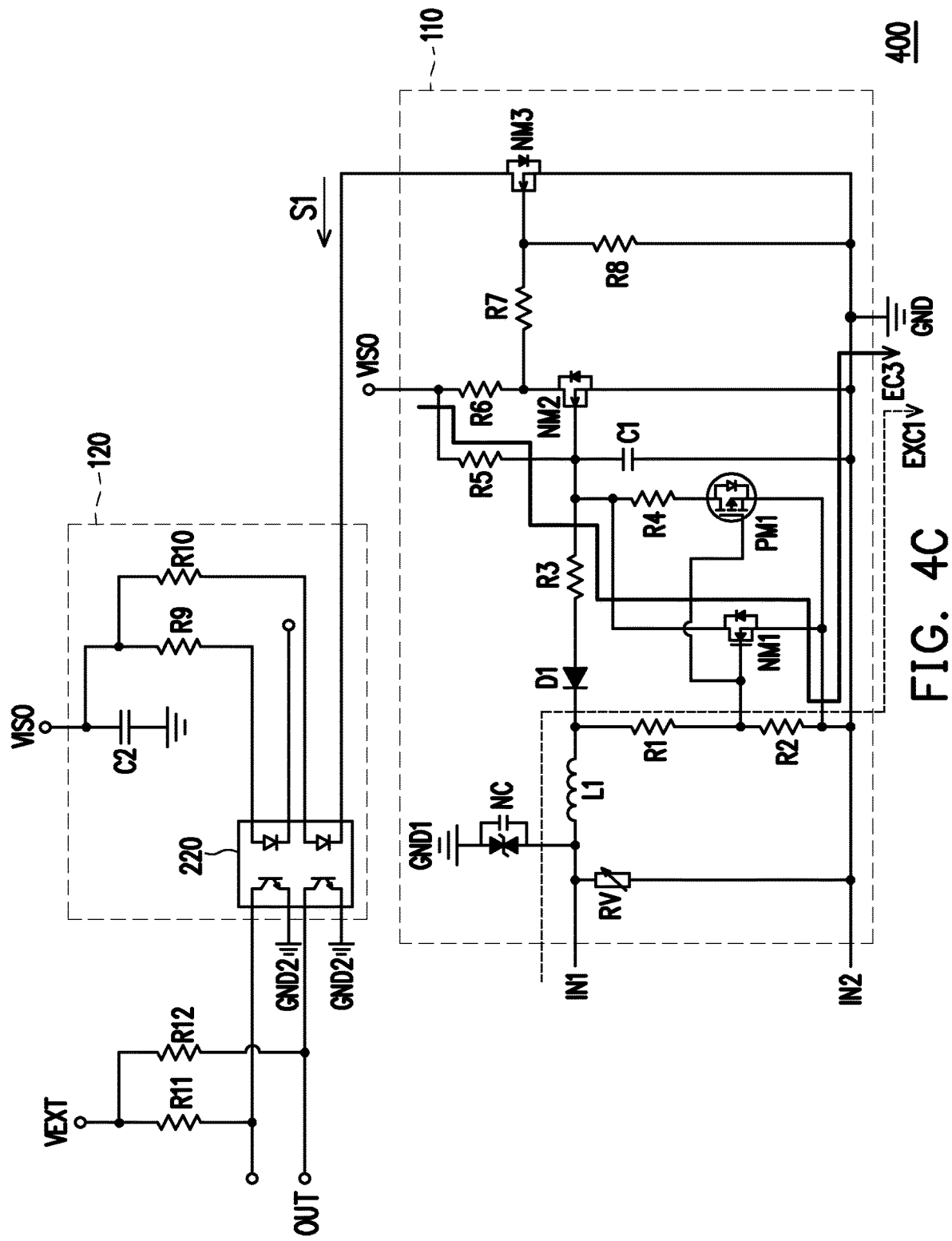

Please refer to FIG. 4C. In an embodiment, if the first input terminal IN1 provides a first voltage to cause the first transistor NM1 and the fourth transistor NM3 to be in the on status and the second transistor PM1 and the third transistor NM2 to be in the off status, a third current EC3 is output from the system power source VISO and flows to the system ground GND through the first transistor NM1, and a first external current EXC1 generated by the first input terminal IN1 flows to the system ground GND. The processing circuit 110 outputs the first signal S1 having a low voltage level through the fourth transistor NM3 so that the single-diode photocoupler 220 is on. At this time, the sensing circuit 120 outputs the sensing signal OUT having a low voltage level according to the first signal S1. Therefore, the system determines that the connection status of the first input terminal IN1 and the second input terminal IN2 is short according to the sensing signal OUT having the low voltage level. For example, since the external user inserts the DIDO connector, and in a situation that the first input terminal IN1 provides a voltage of 15V (that is, a system external lowest potential (system external ground) is shared with the system internal ground GND). At this time, the current flowing through the resistor R5 is 0.7 mA, and a current flowing through the resistor R1 and R2 is 1.154 mA. The voltage difference between the gate terminal and the source terminal of the first transistor NM1 is 3.46 V and is greater than the threshold voltage thereof (2.5V), the voltage difference between the gate terminal and the source terminal of the second transistor PM1 is 3.46 V and is greater than the threshold voltage thereof (−1V), and the voltage difference between the gate terminal and the source terminal of the third transistor NM2 is 0 V and is smaller than the threshold voltage thereof (2.5V), so the first transistor NM1 and the second transistor PM1 are off, and the third transistor NM2 is off, causing the fourth transistor NM3 to be on, so that the single-diode photocoupler 220 is on. The output of the sensing signal OUT is the low voltage level, so the system may know that the connection status of the first input terminal IN1 and the second input terminal IN2 is currently short. Based on the above, the configuration and design of the processing circuit 110 designed in this application with the first switching diode D1 and the first transistor NM1, the second transistor PM1, the third transistor NM2, and the fourth transistor NM3 may allow the user to work normally and protect the peripheral circuit of DIDO of the machine when the user uses an external power supply and the voltage is provided by the first input terminal IN1 (wet contact source mode), and may monitor the power supply status of the connector in real time.

Figure 4D:
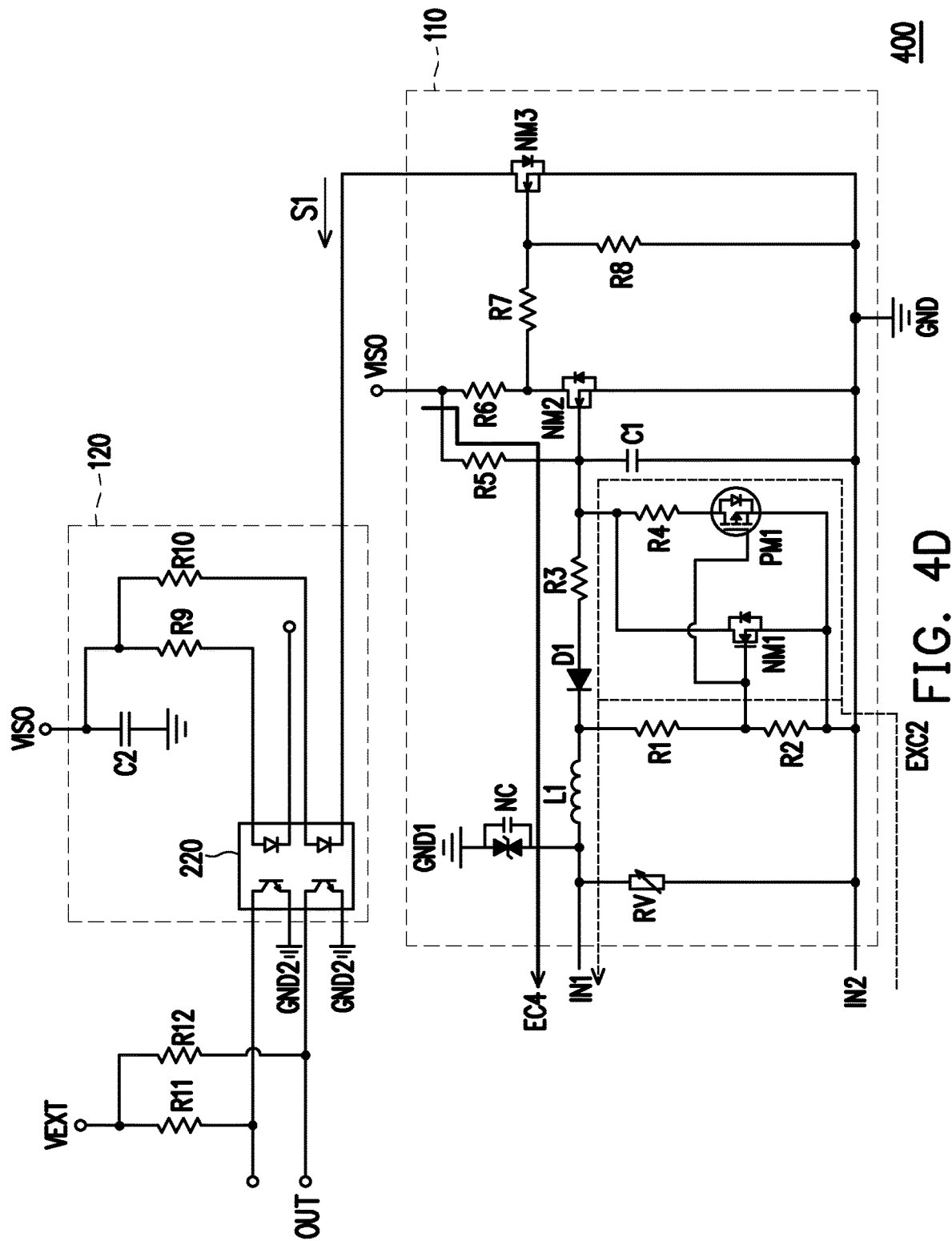

Please refer to FIG. 4D. In an embodiment, if the second input terminal IN2 provides a second voltage to cause the second transistor PM1 and the fourth transistor NM3 to be in the on status and the first transistor NM1 and the third transistor NM2 to be in the off status, a fourth current EC4 is output from the system power source VISO and flows to a system external ground (not shown) through the first switching diode D1 being forward-on. The system external ground may be extended by the first input terminal IN1, and also a second external current EXC2 generated by the second input terminal IN2 flows to the system external ground through the second transistor PM1, the first switching diode D1 being forward-on, the resistor R1, and the resistor R2. The processing circuit 110 outputs the first signal S1 having a low voltage level through the fourth transistor NM3 so that the single-diode photocoupler 220 is on. The sensing circuit 120 outputs the sensing signal OUT having a low voltage level according to the first signal S1. Therefore, the system may determine that the connection status of the first input terminal IN1 and the second input terminal IN2 is short according to the sensing signal OUT having the low voltage level. For example, since the external user inserts the DIDO connector, and in a situation that the second input terminal IN2 provides a voltage of 15V, at this time, the current flowing through the resistor R1 and the resistor R2 is 1.15 mA, a current flowing through the resistor R3 and the first switching diode D1 is 3.412 mA, a current flowing through the resistor R4 is 0.012 mA, and the current flowing through the resistor R5 is 3.4 mA. At this time, since a voltage of the system power source VISO is currently 18.3 V, the voltage difference between the gate terminal and the source terminal of the first transistor NM1 is −3.462 V (i.e., 11.538−15=−3.462V) and is smaller than the threshold voltage thereof (2.5V), the voltage difference between the gate terminal and the source terminal of the second transistor PM1 is −3.462 V (i.e., 11.538−15=−3.462V) and is smaller than the threshold voltage (−1V) thereof, and the voltage difference between the gate terminal and the source terminal of the third transistor NM2 is −12.69 V (i.e., 2.31−15=−12.69 V) and is smaller than the threshold voltage thereof (2.5V). Therefore, the first transistor NM1 is off, the second transistor PM1 is on, and the third transistor NM2 is off, causing a voltage difference between the gate terminal and the source terminal of the fourth transistor NM3 to be 3.298 V and to be on, so that the single-diode photocoupler 220 is on. At this time, the output of the sensing signal OUT is the low voltage level, so the system may determine that the connection status of the first input terminal IN1 and the second input terminal IN2 is currently short.

In an embodiment, if the connector is reversely connected to the processing circuit 110, and when the second input terminal IN2 provides a third voltage to cause the second transistor PM1 and the fourth transistor NM3 to be in the on status, and the first transistor NM1 and the third transistor NM2 are in the off status, the fourth current EC4 is output from the system power source VISO and flows to the system external ground through the first switching diode D1 being forward-on, such as an extension of the first input terminal IN1, and the second external current EXC2 generated by the second input terminal IN2 flows to the system external ground through the second transistor PM1 and the first switching diode D1 being forward-on. At this time, the processing circuit 110 may output the first signal S1 having a low voltage level through the fourth transistor NM3 so that the single-diode photocoupler 220 is on. The sensing circuit 120 outputs the sensing signal OUT having a low voltage level according to the first signal S1. Therefore, the system may determine that the connection status of the first input terminal IN1 and the second input terminal IN2 is short according to the sensing signal OUT having the low voltage level. For example, if the external user accidentally inserts the DIDO connector reversely, and in a situation that the second input terminal of the connector provides an input voltage up to 60 V, that is, the voltage provided by the second input terminal IN2 is greater than the voltage provided by the first input terminal IN1, at this time, the current flowing through the resistor R1 and R2 is 4.6 mA, the current flowing through the resistor R3 and the first switching diode D1 is 12.53 mA, the current flowing through the resistor R4 is 0.053 mA, and the current flowing through the resistor R5 is 12 mA. At this time, since the voltage of the system power source VISO is already 63.3 V, a divided voltage that may be obtained by a voltage of the gate terminal of the first transistor is 46.154 V, so the voltage difference between the gate terminal and the source terminal of the first transistor NM1 is −13.846 V (i.e., 46.154−60=−13.846V) and is smaller than the threshold voltage thereof (2.5V), the voltage difference between the gate terminal and the source terminal of the second transistor PM1 is −13.846 V (i.e., 46.154−60=−13.846V) and is smaller than the threshold voltage thereof (−1V), and the voltage difference between the gate terminal and the source terminal of the third transistor NM2 is −53.347V (i.e., 6.653−60=−53.347 V) and is smaller than the threshold voltage thereof (2.5V). Therefore, the first transistor NM1 is off, the second transistor PM1 is on, and the third transistor NM2 is off, so as to cause the voltage difference between the gate terminal and the source terminal of the fourth transistor NM3 to be 3.298 V and to be on, so that the single-diode photocoupler 220 is on. At this time, the output of the sensing signal OUT is the low voltage level, so the system may determine that the connection status of the first input terminal IN1 and the second input terminal IN2 is currently short. Based on the above, the configuration and design of the processing circuit 110 designed in this application with the first switching diode D1 and the first transistor NM1, the second transistor PM1, the third transistor NM2, and the fourth transistor NM3 may allow the user to work normally and achieve protecting the peripheral circuit of DIDO of the machine or the safety of the connector when the user uses the external power supply and a supplied voltage of the second input terminal IN2 is higher than a system requirement (wet contact sink mode).

Figure 5:
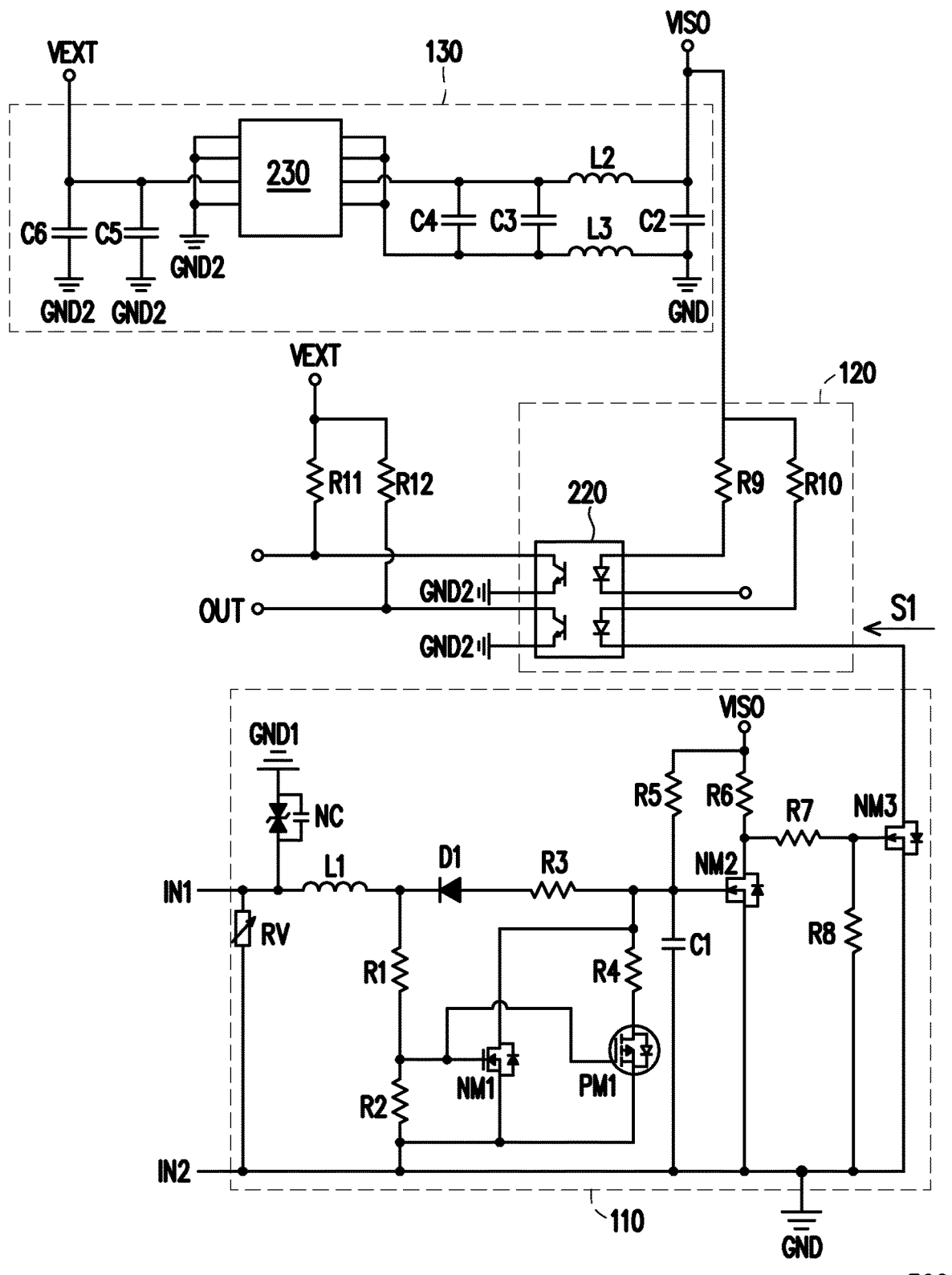
FIG. 5 illustrates a schematic diagram of a system circuit of a photocoupler sensing circuit according to an embodiment of the disclosure.

FIG. 5 illustrates a schematic diagram of a system circuit of a photocoupler sensing circuit according to an embodiment of the disclosure for the convenience of description, but the disclosure is not limited thereto.

Referring to FIG. 5, FIG. 3, and FIG. 4A to FIG. 4D, a photocoupler sensing circuit 500 includes the processing circuit 110, the sensing circuit 120, and the voltage converter circuit 130. In an embodiment, the processing circuit 110 may be similar to the components and coupling methods shown in FIG. 4A to FIG. 4D, which may be referred to and will not be repeated here. The sensing circuit 120 may be similar to the components and coupling methods shown in FIG. 4A to FIG. 4D, which may be referred to and will not be repeated here. However, other components and coupling methods that may achieve the same functions as those of the disclosure are also included in the modified embodiments conceived herein.

In an embodiment, the voltage converter circuit 130 includes a voltage converter 230, condensers C2, C3, and C4 in the system, condensers C5 and C6 outside the system, and inductors L2 and L3 in the system. A first terminal of the inductor L2 is coupled to a terminal of the voltage converter 230 facing the system, a first terminal of the condenser C3, and a first terminal of the condenser C4, and a second terminal of the inductor L2 is coupled to a first terminal of the condenser C2 and the system power source VISO. A first terminal of the inductor L3 is coupled to another terminal of the voltage converter 230 facing the system, a second terminal of the condenser C3, and a second terminal of the condenser C4, and a second terminal of the inductor L3 is coupled to a second terminal of the condenser C2 and the system ground GND. A first terminal of the condenser C5 is coupled to a terminal of the voltage converter 230 facing outside the system, a first terminal of the condenser C6, and the system external power supply source VEXT, and a second terminal of the condenser C5 is coupled to the system external ground GND2. In an embodiment, the voltage converter 230 may be, for example, a DC/DC converter. In an embodiment, a circuit configuration and the number of input pins and output pins (for example, four pins, six pins, or eight pins) and functions of the voltage converter 230 have various applications depending on an increase or a decrease of a voltage input by the user, and the disclosure is not limited thereto. In an embodiment, the voltage converter 230 may also be an AC/DC converter, and the disclosure is not limited thereto.

Figure 6:
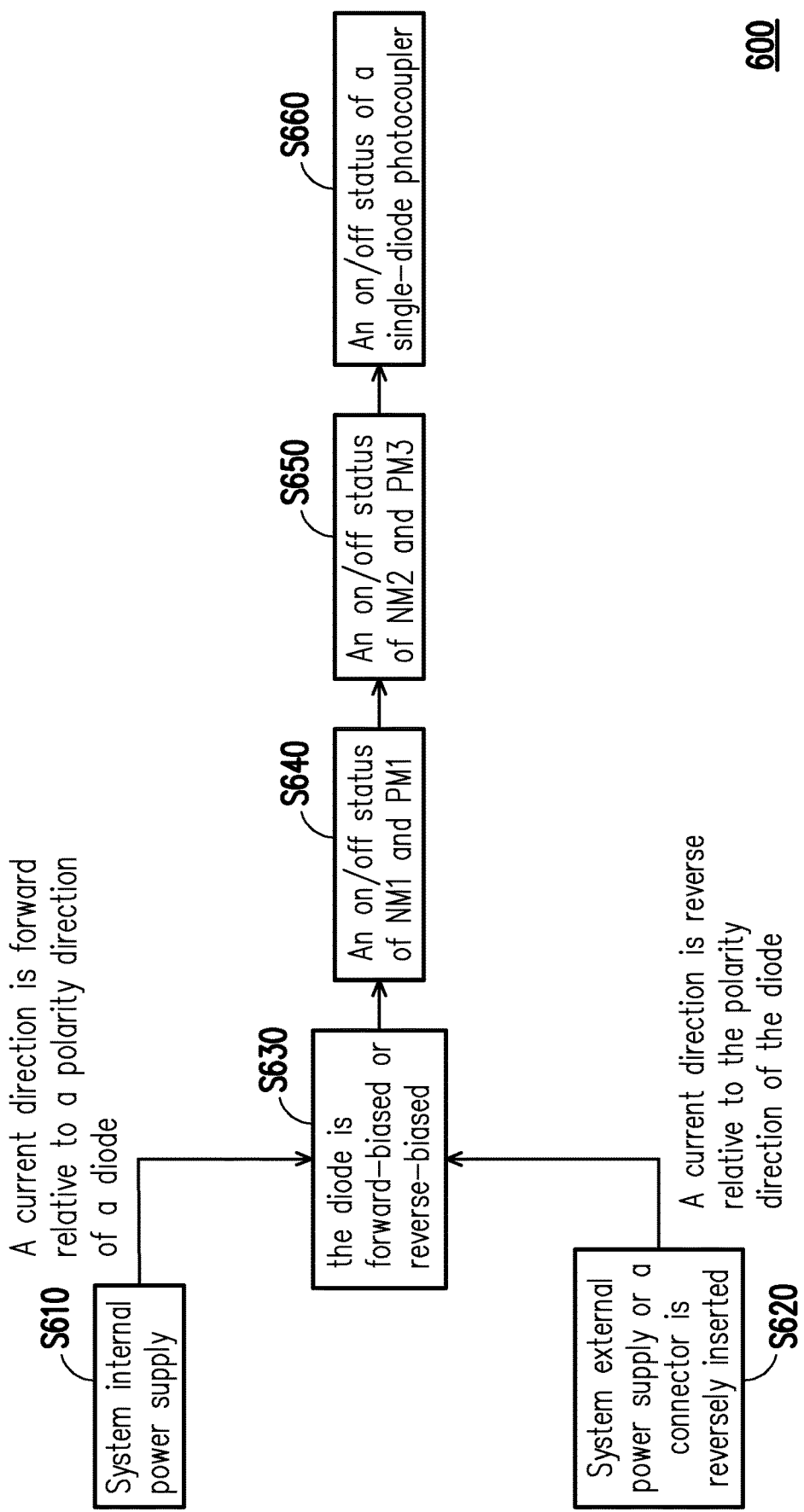
FIG. 6 illustrates an operation flowchart of a photocoupler sensing circuit according to an embodiment of the disclosure.

FIG. 6 illustrates an operation flowchart of a photocoupler sensing circuit according to an embodiment of the disclosure for the convenience of description, but the disclosure is not limited thereto.

Please refer to FIG. 6. An operation flowchart 600 of the photocoupler sensing circuit illustrates a process of determining each component by the photocoupler circuit at different stages. For example, whether the diode is forward-biased or not and the process of the on status or the off status of each transistor switch. Step S610 and Step S620 are, respectively, a situation of system internal power supply is identified and a situation of system external power supply or the connector is reversely inserted by the user is identified. In the situation of system internal power supply, a current direction is forward relative to a polarity direction of the first switching diode. In the situation of system external power supply or the connector is reversely inserted by the user, a current direction is reverse relative to the polarity direction of the first switching diode. In Step S630, whether the first switching diode is forward-biased or reverse-biased is determined. In Step S640, the on/off status of the first transistor and the second transistor are determined. In Step S650, the on/off status of the third transistor and the fourth transistor are determined. In Step S660, the on/off status of the single-diode photocoupler is determined.

FIG. 7 illustrates a diagram of a control status of an internal switch of a photocoupler sensing circuit according to an embodiment of the disclosure for the convenience of description, but the disclosure is not limited thereto.

Please refer to FIG. 7, which illustrates a diagram of statuses of components of different embodiments of the disclosure.

In an embodiment, the connection status of the first input terminal and the second input terminal is open, at this time, the diode is forward-biased, the first transistor is off, the second transistor is off, and the third transistor is on, so as to cause the fourth transistor to be off, and then the photocoupler is not on.

In an embodiment, the connection status of the first input terminal and the second input terminal is short, at this time, the diode is forward-biased, the first transistor is off, the second transistor is off, and the third transistor is off, so as to cause the fourth transistor to be on, and then the photocoupler is on.

In an embodiment, the user provides power (or voltage) from the first input terminal of the connector, at this time, the diode is reverse-biased, the first transistor is on, the second transistor is off, and the third transistor is off, so as to cause the fourth transistor to be on, and then the photocoupler is on.

In an embodiment, the user provides power (or voltage) from the second input terminal of the connector, at this time, the diode is reverse-biased, the first transistor is off, the second transistor is on, and the third transistor is off, so as to cause the fourth transistor to be on, and then the photocoupler is on.

In an embodiment, the user reversely connects the first input terminal and the second input terminal of the connector, at this time, the diode is reverse-biased, the first transistor is off, the second transistor is on, and the third transistor is off, so as to cause the fourth transistor to be on, and then the photocoupler is on.

In summary, the disclosure designs a dual-terminal digital input and output which can support the system internal power supply and the system external power supply (source or sink) simultaneously by using the single-diode photocoupler, so that end users may flexibly choose to use the desired type of digital input and output conveniently, and there is no need to worry about whether the digital input and output function of the machine failing due to incorrect connection caused by which power supply system the external digital input and output belongs to. In addition, the system internal power supply respectively turns on or off the photocoupler of the internal circuit of the machine through an open circuit or a short circuit connection. The system external power supply allows the internal circuit of the machine to respectively turn on or off the photocoupler of the internal circuit of the machine through the voltage (current) source or voltage (current) sink. The single-diode photocoupler design may support the system internal power supply and the system external power supply simultaneously, and can also achieve the bidirectional transmission function of the voltage (current) source or voltage (current) sink for the application of the system external power supply.

Although the disclosure has been disclosed above with the embodiments, the embodiments are not intended to limit the disclosure. Persons with ordinary knowledge in the technical field may make some changes and modifications without departing from the spirit and scope of the disclosure. The scope of protection of the disclosure should be defined by the appended claims.

What is claimed is:

1. A photocoupler sensing circuit, comprising:
    a processing circuit having a first input terminal and a second input terminal and outputting a first signal from an output terminal according to a connection status of the first input terminal and the second input terminal being short, open, or reversely connected; and
    a sensing circuit, coupled to the processing circuit and receiving the first signal, determining to output a sensing signal to a system terminal according to the first signal, so that the system terminal determines whether the connection status of the first input terminal and the second input terminal is short, open, or reversely connected according to the sensing signal, wherein the sensing circuit comprises a single-diode photocoupler coupled to the system terminal.

2. The photocoupler sensing circuit according to claim 1, wherein the processing circuit further comprises:
    a first transistor, wherein a source terminal of the first transistor is coupled to the second input terminal;
    a second transistor, wherein a gate terminal of the second transistor is coupled to a gate terminal of the first transistor, and a source terminal of the second transistor is coupled to the source terminal of the first transistor and the second input terminal; and
    a third transistor, wherein a gate terminal of the third transistor is coupled to a drain terminal of the first transistor, and a source terminal of the third transistor is coupled to the second input terminal, wherein the gate terminal of the third transistor is coupled to the gate terminal of the first transistor through a diode.

3. The photocoupler sensing circuit according to claim 2, wherein the processing circuit further comprises:
    a fourth transistor, wherein a gate terminal of the fourth transistor is coupled to a drain terminal of the third transistor, wherein the gate terminal of the fourth transistor is coupled to a system power source and a source terminal of the fourth transistor is coupled to a system ground.

4. The photocoupler sensing circuit according to claim 2, wherein the processing circuit determines whether the first transistor is on or not on according to a magnitude relationship between a first voltage between the source terminal and the gate terminal of the first transistor and a first threshold voltage of the first transistor.

5. The photocoupler sensing circuit according to claim 2, wherein the processing circuit determines whether the second transistor is on or not on according to a magnitude relationship between a second voltage between the source terminal and the gate terminal of the second transistor and a second threshold voltage of the second transistor.

6. The photocoupler sensing circuit according to claim 2, wherein the gate terminal of the third transistor is coupled to a P-type terminal of the diode, and the gate terminal of the first transistor is coupled to an N-type terminal of the diode.

7. The photocoupler sensing circuit according to claim 2, wherein the gate terminal of the second transistor is coupled to an N-type terminal of the diode, and a drain terminal of the second transistor is coupled to a P-type terminal of the diode.

8. The photocoupler sensing circuit according to claim 2, wherein the processing circuit further comprises:
    a protection diode, wherein a terminal of the protection diode is coupled to a system external ground, and another terminal of the protection diode is coupled to the first input terminal; and
    a protection resistor, wherein a terminal of the protection resistor is coupled to the first input terminal, and another terminal of the protection resistor is coupled to the second input terminal, wherein a resistance value of the protection resistor changes with a voltage difference between the first input terminal and the second input terminal.

9. The photocoupler sensing circuit according to claim 2, wherein in response to the first input terminal and the second input terminal being open, the first transistor and the second transistor are in an off status and the third transistor is in an on status, a first current is output from a system power source and flows to a system ground through the diode being forward-on, and the processing circuit does not output the first signal so as to cause the single-diode photocoupler to be not on, wherein the sensing circuit outputs the sensing signal having a high voltage level in response to not receiving the first signal, and the system terminal determines that the connection status of the first input terminal and the second input terminal is open according to the sensing signal having the high voltage level.

10. The photocoupler sensing circuit according to claim 3, wherein in response to the connection status of the first input terminal and the second input terminal being short, the first transistor, the second transistor, and the third transistor are in an off status, a second current is output from the system power source and flows to the system ground through the diode being forward-on, and the processing circuit outputs the first signal having a low voltage level through the fourth transistor so that the single-diode photocoupler is on, wherein the sensing circuit outputs the sensing signal having a low voltage level according to the first signal, and the system terminal determines that the connection status of the first input terminal and the second input terminal is short according to the sensing signal having the low voltage level.

11. The photocoupler sensing circuit according to claim 3, wherein in response to the first input terminal providing a first voltage to cause the first transistor and the fourth transistor to be in the on status and the second transistor and the third transistor to be in the off status, a third current is output from the system power source and flows to the system ground through the first transistor, a first external current generated by the first input terminal flows to the system ground, and the processing circuit outputs the first signal having a low voltage level through the fourth transistor so that the single-diode photocoupler is on, wherein the sensing circuit outputs the sensing signal having a low voltage level according to the first signal, and the system terminal determines that the connection status of the first input terminal and the second input terminal is short according to the sensing signal having the low voltage level.

12. The photocoupler sensing circuit according to claim 3, wherein in response to the second input terminal providing a second voltage to cause the second transistor and the fourth transistor to be in the on status and the first transistor and the third transistor to be in the off status, a fourth current is output from the system power source and flows to a system external ground through the diode being forward-on, a second external current generated by the second input terminal flows to the system external ground through the second transistor, and the processing circuit outputs the first signal having a low voltage level through the fourth transistor so that the single-diode photocoupler is on, wherein the sensing circuit outputs the sensing signal having a low voltage level according to the first signal, and the system terminal determines that the connection status of the first input terminal and the second input terminal is short according to the sensing signal having the low voltage level.

13. The photocoupler sensing circuit according to claim 3, wherein in response to the second input terminal providing a third voltage to cause the second transistor and the fourth transistor to be in the on status, the first transistor and the third transistor are in the off status, a fourth current is output from the system power source and flows to a system external ground through the diode being forward-on, a second external current generated by the second input terminal flows to the system external ground through the second transistor, and the processing circuit outputs the first signal having a low voltage level through the fourth transistor so that the single-diode photocoupler is on, wherein the sensing circuit outputs the sensing signal having a low voltage level according to the first signal, so that the system terminal determines that the connection status of the first input terminal and the second input terminal is short according to the sensing signal having the low voltage level.

14. The photocoupler sensing circuit according to claim 13, wherein the third voltage is greater than a voltage of the system power source.

15. An operation method of a photocoupler sensing circuit, comprising:
outputting a first signal from an output terminal according to a connection status of a first input terminal and a second input terminal of a processing circuit being short, open, or reversely connected;
transmitting the first signal to a sensing circuit to determine according to the first signal to output a sensing signal; and
determining whether the connection status is short, open, or reversely connected according to the sensing signal,
wherein the sensing circuit comprises a single-diode photocoupler, and the single-diode photocoupler is determined to be on or not on according to the first signal.

16. The operation method according to claim 15, wherein the step of determining whether the connection status is short or open according to the sensing signal comprises:
outputting a first current to a system ground through a diode being forward-on;
not outputting the first signal to cause the single-diode photocoupler to be not on, wherein the sensing circuit outputs the sensing signal having a high voltage level in response to not receiving the first signal; and
determining that the connection status of the first input terminal and the second input terminal is open according to the sensing signal having the high voltage level.

17. The operation method according to claim 15, wherein the step of determining whether the connection status is short or open according to the sensing signal comprises:
outputting a second current to a system ground through a diode being forward-on;
outputting the first signal having a low voltage level to cause the single-diode photocoupler to be on, wherein the sensing circuit outputs the sensing signal having a low voltage level according to the first signal; and
determining that the connection status of the first input terminal and the second input terminal is short according to the sensing signal having the low voltage level.

18. The operation method according to claim 15, wherein the step of determining whether the connection status is short or open according to the sensing signal comprises:
outputting a third current to a system ground through a first transistor;
outputting a first external current to the system ground;
outputting the first signal having a low voltage level to cause the single-diode photocoupler to be on, wherein the sensing circuit outputs the sensing signal having a low voltage level according to the first signal; and determining that the connection status of the first input terminal and the second input terminal is short according to the sensing signal having the low voltage level.

19. The operation method according to claim 15, wherein the step of determining whether the connection status is short or open according to the sensing signal comprises:
  outputting a fourth current to a system external ground through a diode being forward-on;
  outputting a second external current to the system external ground through a second transistor;
  outputting the first signal having a low voltage level to cause the single-diode photocoupler to be on, wherein the sensing circuit outputs the sensing signal having a low voltage level according to the first signal; and
  determining that the connection status of the first input terminal and the second input terminal is short according to the sensing signal having the low voltage level.

20. The operation method according to claim 19, wherein a voltage provided by the second input terminal is greater than a voltage provided by the first input terminal.

* * * * *